United States Patent
Frank et al.

(10) Patent No.: US 6,681,462 B1
(45) Date of Patent: Jan. 27, 2004

(54) METHOD FOR PRODUCING A PIEZOELECTRIC STRUCTURAL UNIT

(75) Inventors: Wilhelm Frank, Bamberg (DE); Günter Lewentz, Regensburg (DE); Andreas Voigt, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/499,853

(22) Filed: Feb. 7, 2000

Related U.S. Application Data

(63) Continuation of application No. PCT/DE98/02061, filed on Jul. 22, 1998.

(30) Foreign Application Priority Data

Aug. 5, 1997 (DE) .......................................... 197 33 858

(51) Int. Cl.⁷ ........................ H04R 17/00; H01L 41/053
(52) U.S. Cl. .......................... 29/25.35; 29/450; 29/451; 310/338; 310/348
(58) Field of Search ................................ 29/25.35, 450, 29/451, 594; 310/338, 369, 348

(56) References Cited

U.S. PATENT DOCUMENTS

| | | | |
|---|---|---|---|
| 2,887,770 A | * | 5/1959 | Spence ........................ 29/450 |
| 3,230,774 A | * | 1/1966 | Ostrow ........................ 310/338 |
| 4,460,842 A | | 7/1984 | Waanders et al. |
| 4,471,256 A | * | 9/1984 | Igashira et al. .............. 310/369 |
| 4,823,041 A | * | 4/1989 | Inoue et al. ................. 310/369 |
| 5,097,172 A | * | 3/1992 | Becka .......................... 310/348 |
| 5,132,942 A | * | 7/1992 | Cassone ....................... 29/594 |

FOREIGN PATENT DOCUMENTS

| | | | |
|---|---|---|---|
| DE | 3705-471 | * 9/1988 | ................. 310/338 |
| DE | 38 44 134 C2 | 7/1989 | |
| DE | 196 53 555 A1 | 6/1998 | |

OTHER PUBLICATIONS

Derwent Abstract of Japanese Patent Application No. JP 09–196587.

* cited by examiner

*Primary Examiner*—A. Dexter Tugbang
(74) *Attorney, Agent, or Firm*—Laurence A. Greenberg; Werner H. Stemer; Ralph E. Locher

(57) ABSTRACT

A method for producing a structural unit with a prestressed piezoelectric actuator includes the steps of inserting a front end of the actuator into a hollow body, form-lockingly or force-lockingly connecting the inserted front end of the actuator to the hollow body, pressing the actuator into the hollow body with a defined force establishing a prestress of the actuator, and force-lockingly or form-lockingly connecting the actuator to the hollow body in the vicinity of a rear end of the actuator, for fixing the prestress of the actuator.

3 Claims, 6 Drawing Sheets

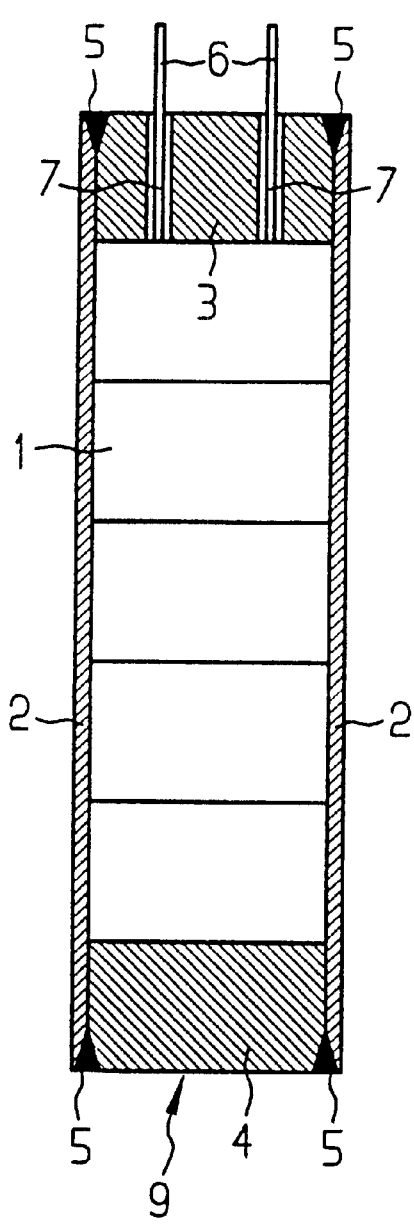
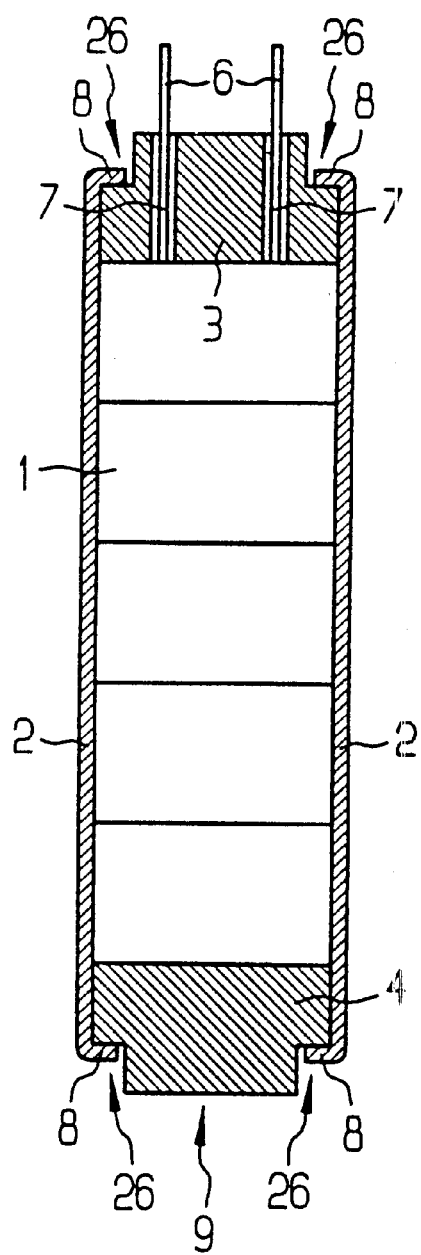

METHOD FOR PRODUCING A PIEZOELECTRIC STRUCTURAL UNIT

CROSS-REFERENCE TO RELATED APPLICATION

This application is a continuation of copending International Application No. PCT/DE98/02061, filed Jul. 22, 1998, which designated the United States.

BACKGROUND OF THE INVENTION

Field of the Invention

The invention relates to a piezoelectric assembly including a piezoelectric actuator prestressed and inserted into an elastic hollow body in an extension direction between a top and a bottom cover plate connected to the hollow body. The invention also relates to a method for producing a structural unit with a prestressed piezoelectric actuator and to a method for producing a hollow body used to prestress a piezoelectric actuator.

Piezoelectric actuators are used, for example, in motor-vehicle technology to control an injection valve of an internal combustion engine. German Published, Non-Prosecuted Patent Application DE 196 53 555 A1 describes a piezoelectric actuator which is preloaded by a spring device against a cover plate of a housing. The cover plate is screwed through the use of a screw joint to the housing, in which the spring device and the piezoelectric actuator are situated.

German Patent DE 38 44 134 C2 has disclosed an injection valve which has a piezoelectric actuator as a final control element. The actuator is inserted into a hollow-cylindrical spring and is preloaded against a housing of the injection valve by the spring. The injection valve has a complex construction and, moreover, the preloading of the actuator is dependent on manufacturing tolerances of the housing.

SUMMARY OF THE INVENTION

It is accordingly an object of the invention to provide a piezoelectric assembly, a method for producing a structural unit with a prestressed piezoelectric actuator and a method for producing a hollow body for prestressing the piezoelectric actuator, which overcome the hereinafore-mentioned disadvantages of the heretofore-known devices and methods of this general type, in which the assembly has a simple construction and is optimized in terms of installation space and in which the methods are simple and economical.

With the foregoing and other objects in view there is provided, in accordance with the invention, a piezoelectric assembly, comprising an elastic hollow body; a top cover plate connected to the hollow body by one of welding and flanging, and a bottom cover plate connected to the hollow body; and a piezoelectric actuator having an extension direction, the actuator inserted into the hollow body in the extension direction between the cover plates for prestressing the actuator.

In accordance with another feature of the invention, the hollow body has a given length, two butting edges and at least one connecting seam connecting the two butting edges to one another and extending entirely over the given length.

In accordance with a further feature of the invention, the hollow body has a longitudinal direction and two butting edges associated with one another and disposed in the longitudinal direction, the butting edges not being connected to one another.

In accordance with an added feature of the invention, the hollow body has apertures at least partially determining an elasticity of the hollow body.

In accordance with an additional feature of the invention, the hollow body is made of at least one plate formed into the hollow body and then fixed by at least one connecting seam.

With the objects of the invention in view, there is also provided a method for producing a piezoelectric structural unit, which comprises inserting a front end of a piezoelectric actuator into a hollow body; force-lockingly or form-lockingly connecting the inserted front end of the actuator to the hollow body; pressing the actuator into the hollow body with a defined force establishing a prestress of the actuator; and force-lockingly or form-lockingly connecting the actuator to the hollow body in the vicinity of a rear end of the actuator, for fixing the prestress of the actuator.

In accordance with another mode of the invention, there is provided a method which comprises force-lockingly or form-lockingly connecting an open end of the hollow body to a first cover plate for closing the open end, before the step of inserting the actuator; placing a second top plate on the inserted actuator and pressing the second top plate into the hollow body with a given force; and force-lockingly or form-lockingly connecting the second cover plate to the hollow body while maintaining the given force, for permanently prestressing the actuator with the hollow body.

In accordance with a further mode of the invention, there is provided a method which comprises elastically elongating the hollow body during the prestressing of the actuator with the given force.

With the objects of the invention in view, there is additionally provided a method for the production of a hollow body, which comprises producing a plate with a defined area; forming apertures in the plate for affecting an elasticity of the plate; forming the plate into a hollow body to be used to prestress a piezoelectric actuator; and fixing a shape of the formed plate.

In accordance with a concomitant mode of the invention, there is provided a method which comprises at least partially compacting an edge bounding at least one of the apertures.

A significant advantage of the invention is that the piezoelectric actuator is surrounded by a hollow body, and the hollow body forms a single structural unit with the prestressed piezoelectric actuator. The prestress of the actuator is permanently fixed during the production of the structural unit. The actuator thus does not need to be prestressed again every time it is removed and installed. The structural unit is therefore easy to install, requires little maintenance and is economical in terms of cost.

Other features which are considered as characteristic for the invention are set forth in the appended claims.

Although the invention is illustrated and described herein as embodied in a piezoelectric assembly, a method for producing a structural unit with a prestressed piezoelectric actuator and a method for producing a hollow body for prestressing the piezoelectric actuator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, sectional view of a first embodiment of a prestressed piezoelectric actuator;

FIG. 2 is a sectional view of a second embodiment of the piezoelectric actuator;

DESCRIPTION OF THE PREFERRED EMBODIMENTS

Figure 3:
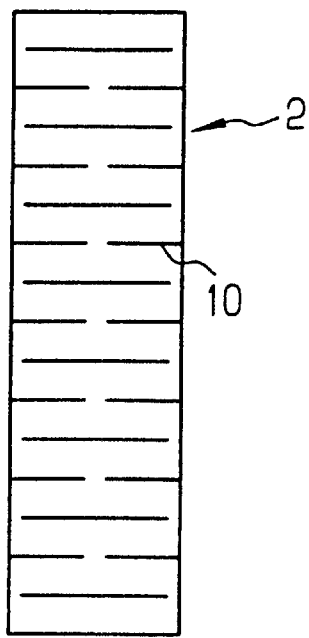
FIG. 3 is an elevational view of a sleeve with transverse slots.

Referring now to the figures of the drawings in detail and first, particularly, to FIG. 1 thereof, there is seen a piezoelectric actuator 1 which includes a plurality of individual piezoelectric elements stacked one upon the other. The piezoelectric actuator 1 is introduced into a hollow body, mould, shape or form 2. The hollow body or mould 2 is, for example, a sleeve with an annular cross section or a rectangular-section tube profile. The hollow body or mould 2 is preferably matched in shape to the shape of the piezoelectric actuator 1. A bottom end of the piezoelectric actuator 1 rests on a bottom cover plate 4, which is force-lockingly and/or form-lockingly connected to the hollow body or mould 2. In this illustrative embodiment, the bottom cover plate 4 is form-lockingly connected to the hollow body or mould 2 by a weld 5. A form-locking connection is one which connects two elements together due to the shape of the elements themselves, as opposed to a force-locking connection, which locks the elements together by force external to the elements.

A top end of the piezoelectric actuator 1 rests against an upper cover plate 3, which is likewise form-lockingly and/or force-lockingly connected to the hollow body or mould 2. In this illustrative embodiment, the top cover plate 3 is form-lockingly connected to the hollow body or mould 2 by a weld 5.

The top cover plate 3 has passages 7 through which contact pins 6 of the piezoelectric actuator are passed. The contact pins 6 are used to make the piezoelectric actuator capable of being activated for extension or expansion. The piezoelectric actuator 1 is prestressed with a defined force by the hollow body or mould 2 and the bottom and top cover plates 3, 4 so as to resist deflection. In order to achieve this, the hollow body or mould 2 is manufactured from a correspondingly elastic material. Preferred materials are those with a low modulus of elasticity, such as a copper-beryllium alloy ($CuBe_2$) and/or those with a high strength characteristic, such as spring steel.

A further improvement in the elastic properties of the hollow body or mould 2 is achieved by making apertures in the hollow body or mould 2. Different shapes of the apertures are illustrated in greater detail in FIGS. 3 to 7.

FIG. 2 shows a prestressed piezoelectric actuator 1 which, as in FIG. 1, is clamped between a top cover plate and a bottom cover plate 3, 4 by a hollow body or mould 2. In this example, the connection between the hollow body or mould 2 and the top and bottom cover plates 3, 4 is effected through the use of flanges 8. For this purpose, the top and bottom cover plates 3, 4 preferably have recesses 26 into which respective flanged top and bottom edge regions of the hollow body or mould 2 engage. In a simple embodiment, no recesses 26 are provided and the top and bottom edge regions are simply flanged around the top and bottom edges of the top and bottom cover plates 3, 4.

A significant advantage of the structural units illustrated in FIG. 1 and FIG. 2, which are constructed of the top and bottom cover plates 3, 4, the hollow body or mould 2 and the piezoelectric actuator 1, is that the prestress of the piezoelectric actuator is permanently fixed through the use of the fixed connection to the hollow body or mould 2. This means that there is no need for readjustment during the entire service life of the actuator.

The piezoelectric actuator 1, the hollow body or mould 2 and the top and bottom cover plates 3, 4 form a compact structural unit which can be transported without problems and can be installed in a corresponding final control element, in particular an injection valve, in a simple operation. The structural unit 1, 2, 3, 4 can be removed from the final control element without any change in the prestress of the piezoelectric actuator 1. In addition, the structural unit can be manufactured at relatively reasonable cost.

FIG. 3 shows a hollow body or mould 2 that forms a cylindrical sleeve in which transverse slots 10 are made perpendicularly to the longitudinal axis. The number and length of the transverse slots 10 are such that the elasticity of the hollow body or mould 2 is matched to the desired manner of operation of the prestressed piezoelectric actuator according to FIGS. 1 and 2.

Figure 4:
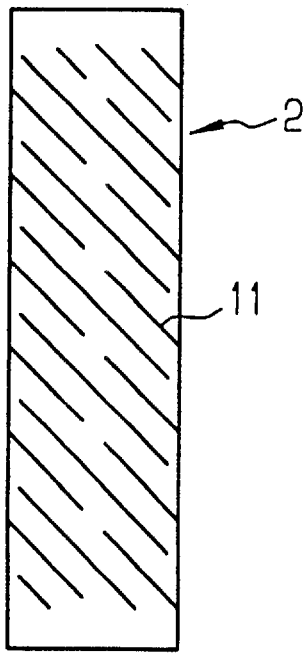
FIG. 4 is an elevational view of a sleeve with oblique slots.

FIG. 4 shows a hollow body or mould 2 that forms a cylindrical sleeve in which oblique slots 11 are made obliquely to the longitudinal axis of the hollow body or mould 2.

Figure 5:
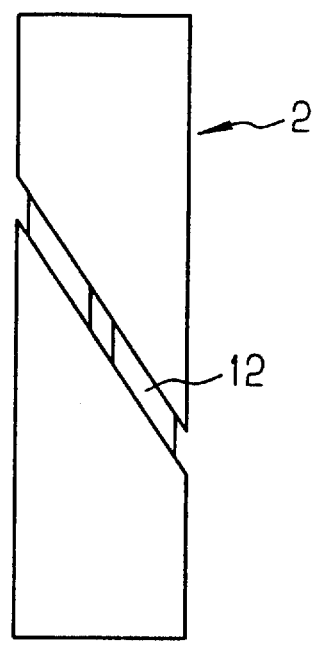
FIG. 5 is an elevational view of a sleeve with one oblique aperture.

FIG. 5 shows a hollow body or mould 2 that forms a cylindrical sleeve in which an oblique aperture 12 running in a spiral around the hollow body or mould 2 is made. In this case, at least part of the hollow body or mould 2 is in the form of a cylindrical spiral.

Figure 6:
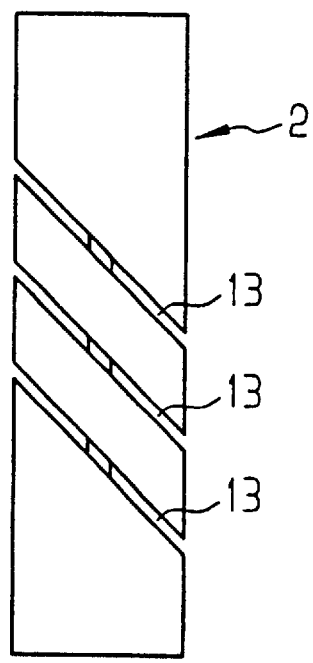
FIG. 6 is an elevational view of a sleeve with a plurality of oblique apertures.

FIG. 6 shows a hollow body or mould 2 that forms a cylindrical sleeve in which a plurality of slots 13 disposed parallel to one another and in a spiral relative to the longitudinal axis of the hollow body or mould 2 are made. Due to the slots 13, at least part of the hollow body or mould 2 forms a plurality of cylindrical spring elements in the form of spirals.

Figure 7:
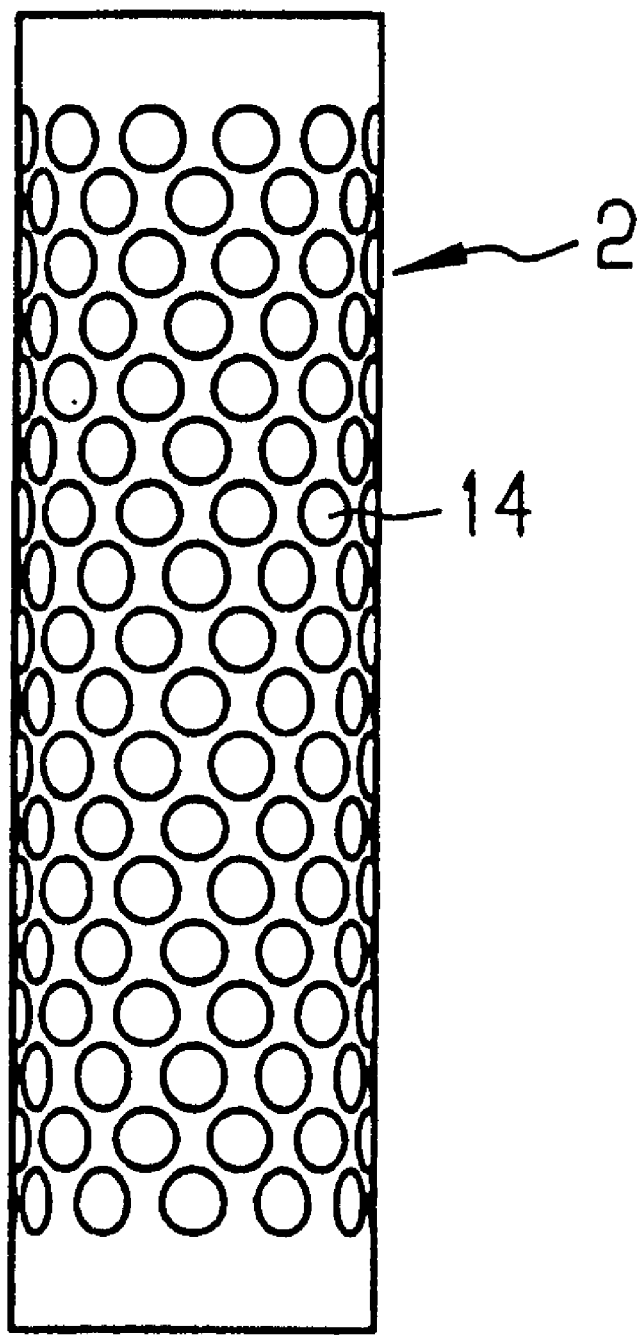
FIG. 7 is an elevational view of a sleeve with round apertures.

FIG. 7 shows a hollow body or mould 2 that is constructed as a cylindrical sleeve in which circular apertures 14 are made.

The number and geometry of the apertures and slots in FIGS. 3 to 7 are chosen in such a way that the elasticity of the hollow body or mould 2 in the longitudinal direction, i.e.

parallel to the direction of deflection of the piezoelectric actuator 1, is matched to the desired manner of operation of the piezoelectric actuator 1.

The hollow body or moulds 2 illustrated in FIGS. 3 to 7 are preferably constructed as thin-walled hollow body or moulds which are produced from a simple, thin-walled and preferably drawn tube.

An advantageous method for producing the hollow body 2 includes making apertures and/or slots in a plate of defined thickness and defined dimensions in a first operation. The shape of the plate offers the advantage of making the plate readily accessible for the introduction of the apertures, and the apertures can be made in a wide variety of geometries, numbers and configurations, for example by inexpensive punching.

An edge region of an aperture is preferably slightly plastically deformed, resulting in hardening of the plate due to an introduced internal compressive stress. A corresponding hardening can also be achieved, for example, by shot peening the edge regions of the aperture.

This has a highly strength-enhancing effect, particularly in the case of dynamic loading of the hollow body or mould 2. This is achieved, for example, if the punch with which the apertures are made in the plate is widened to a larger cross section, after the punching cross section, as seen in the direction of punching. As a result, the desired aperture is punched out of the plate first and then the edge region of the aperture is compacted. This introduces an internal compressive stress into the edge region of the aperture which results in good fatigue strength. During this process, the thickness of the edge is preferably increased. The edge may be bent slightly out of the plane of the plate, depending on the type of working. This can, for example, be an indication of compaction of the edge.

The plate is then formed to provide the desired hollow body or mould 2 and fixed in the hollow body or mould 2 through the use of a weld. A seam which is formed in this process is preferably welded with a laser. Non-uniformities in the weld are eliminated by a heat treatment.

As an alternative, it is also possible for the tubular shape to be fixed by connecting the hollow body or mould 2 to the top and bottom cover plates 3, 4. In this case, butting edges, which are usually welded, are not connected to one another. The butting edges illustrated in FIGS. 8 to 11, which form seams 15, 17, 16, 18, are thus not connected to one another in this illustrative embodiment. An advantageous distribution of the spring and pressure forces is thereby achieved.

Figure 8:
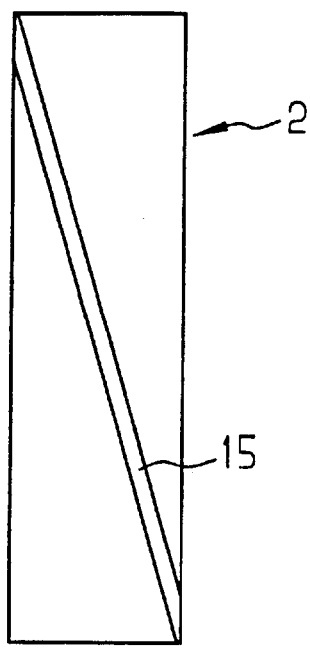
FIG. 8 is an elevational view of a sleeve with an oblique connecting seam.
Figure 10:
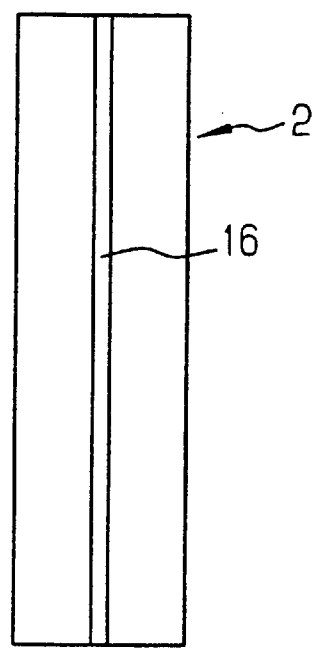
FIG. 10 is an elevational view of a sleeve with a straight connecting seam.
Figure 9:
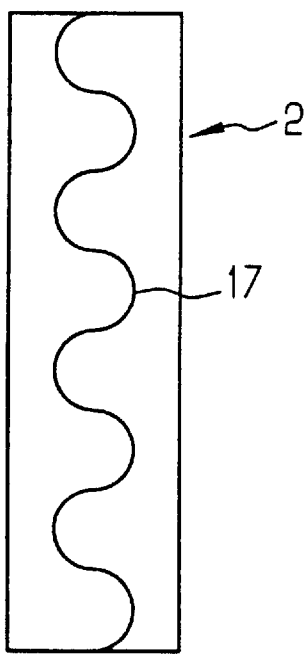
FIG. 9 is an elevational view of a sleeve with a wavy connecting seam.
Figure 11:
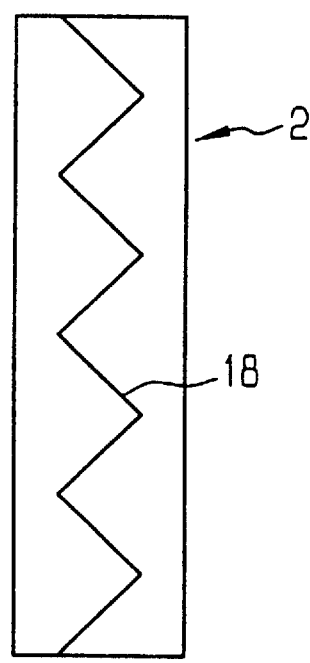
FIG. 11 is an elevational view of a sleeve with a crisscross connecting seam.

FIGS. 8 to 11 show various forms of seams 15, 16, 17, 18 which connect two butting edges of a formed plate and thus fix the hollow body or mould 2. FIG. 8 shows an oblique seam 15 disposed obliquely to the longitudinal axis of the sleeve shape 2. FIG. 9 shows a wavy seam 17, which is disposed symmetrically with respect to the longitudinal direction of the hollow body or mould 2 and is disposed in the form of a sine wave parallel to the longitudinal direction of the sleeve shape 2. FIG. 10 shows a longitudinal seam 16 disposed parallel to the longitudinal direction of the hollow body or mould 2. FIG. 11 shows a crisscross seam 18 disposed symmetrically with respect to the longitudinal axis of the hollow body or mould 2. The crisscross seam 18 is disposed in the form of a zigzag line in the longitudinal direction relative to the hollow body or mould 2. The seams 15, 16, 17, 18 are preferably welded.

The spring rate of the hollow body or mould 2 can be adjusted within wide limits through the use of the following parameters: inside and outside diameter of the sleeve mould, wall thickness, material with suitable modulus of elasticity, number of apertures, geometry of the apertures (holes, grooves, spiral grooves, etc.), and configuration of the apertures (horizontally, vertically, obliquely and, in the case of spiral grooves: slope, number of flights, groove width, etc.).

The apertures are, for example, made by drilling, punching, milling, erosion or electrochemical methods.

Figure 12:
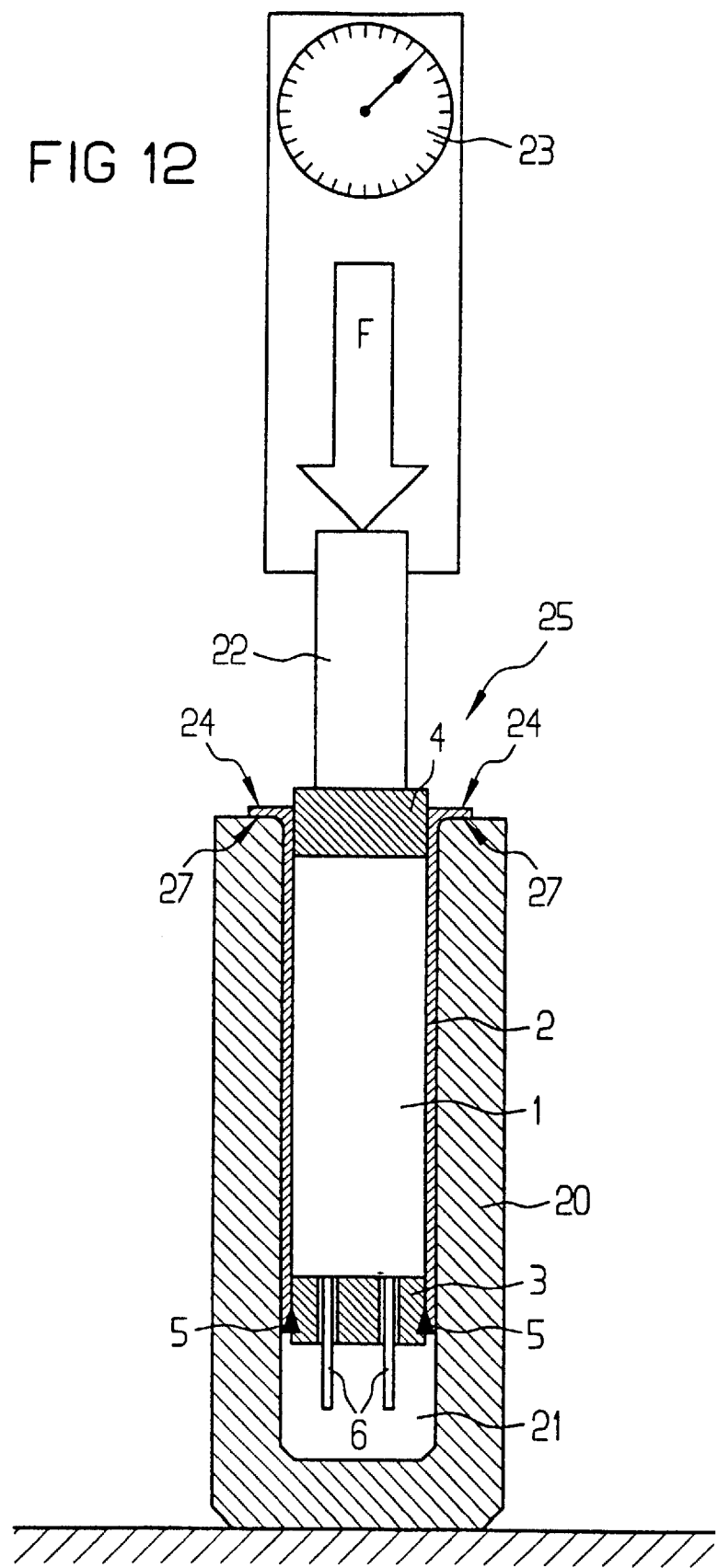
FIG. 12 is a partly sectional view of an assembly apparatus for producing a prestressed actuator.

FIG. 12 shows an assembly configuration through the use of which a piezoelectric actuator 1 is installed in a sleeve-shaped hollow body or mould 2 with a precisely defined force. For this purpose, one end of the hollow body or mould 2 is form-lockingly and/or force-lockingly connected to a top cover plate 3 having passages 7. The hollow body or mould 2 has a bearing edge 24 which points radially outward at another end. The hollow body or mould 2 is inserted, top cover plate 3 first, into an assembly fixture 20. The assembly fixture 20 has an assembly recess 21 which matches the cross section of the hollow body or mould 2 in such a way that the hollow body or mould 2 can be inserted into the assembly recess 21 with the bearing edge 24 supported in a bearing region 27 of the assembly fixture 20. A piezoelectric actuator 1 is then inserted, contact pins 6 at a front end first, into the hollow body or mould 2. A bottom cover plate 4 is then inserted into the hollow body or mould 2 and pressed into the hollow body or mould 2 with a defined force by an assembly device 23 using a punch 22, so that the hollow body or mould 2 is thereby elongated elastically.

The defined force corresponds to the desired prestress of the piezoelectric actuator 1. While maintaining the force, the bottom cover plate 4 is then force-lockingly and/or form-lockingly connected to the hollow body or mould 2, preferably by being welded to it. This connects the actuator to the hollow body in the vicinity of the rear end of the actuator and fixes the prestress of the piezoelectric actuator 1.

Figure 13:
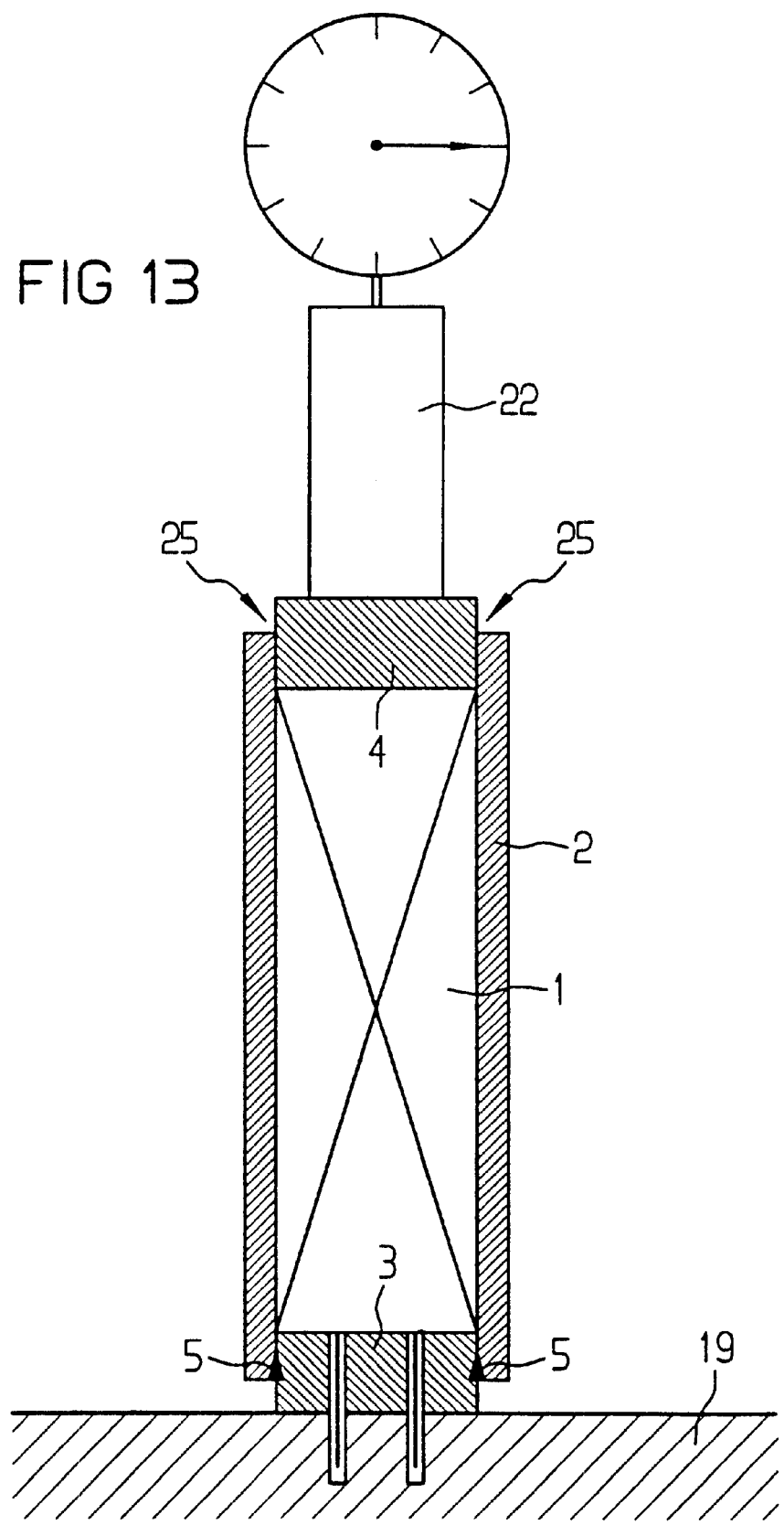
FIG. 13 is a view similar to FIG. 12 of another assembly apparatus for prestressing an actuator.

FIG. 13 shows a second variant of the assembly configuration. In contrast to the configuration in FIG. 12, the hollow body or mould 2 remains unloaded during assembly, and the bent-over bearing edge 27 shown in FIG. 12 can be omitted. For this purpose, one end of the hollow body or mould is form-lockingly and/or force-lockingly connected to the top cover plate 3 having the passages 7, the piezoelectric actuator 1 is introduced into the hollow body or mould 2 and, as shown in FIG. 13, inserted with the contact pins of the piezoelectric actuator 1 entering into depressions that are provided for this purpose in a baseplate 19. The bottom cover plate 4 is then placed on the actuator 1, pressed into the hollow body or mould through the use of a punch 22 of an assembly fixture 20, and then form-lockingly and/or force-lockingly connected to this hollow body or mould, preferably by being welded to it. The force which is used for pressing in compresses only the piezoelectric actuator 1 and the cover plates 3, 4. After the relief of the load on the assembly fixture 20, the actuator 1 expands and, in the process, stresses the hollow body or mould 2. The force used for pressing in must be calculated, while taking the stiffnesses of the actuator 1 and the hollow body or mould 2 into account, in such a way that a defined prestressing force is established after the relief of the load on the system.

Length tolerances of the piezoelectric actuator 1 which are inherent in production can preferably be compensated for by grinding the bottom cover plate 4. Grinding can furthermore be employed to correct any deviation from parallelism of the end surfaces of the piezoelectric actuator 1. For this purpose, the bottom cover plate 4 should be ground at a corresponding angle.

We claim:

1. A method for producing a piezoelectric structural unit, which comprises:
   a) inserting a front end of a piezoelectric actuator into a hollow body having a longitudinal direction;
   b) force-lockingly or form-lockingly connecting the inserted front end of the actuator to the hollow body;
   c) pressing the actuator into the hollow body with a defined force in the longitudinal direction for prestressing and establishing a desired prestress of the actuator in the longitudinal direction; and then
   d) force-lockingly or form-lockingly connecting the actuator to the hollow body in the vicinity of a rear end of the actuator, for fixing the desired prestress of the actuator.

2. The method according to claim 1, which further comprises:

force-lockingly or form-lockingly connecting an open end of the hollow body to a first cover plate for closing the open end, before the step of inserting the actuator;

placing a second top plate on the inserted actuator and pressing the second top plate into the hollow body with a given force; and force-lockingly or form-lockingly connecting the second cover plate to the hollow body while maintaining the given force, for permanently prestressing the actuator with the hollow body in the longitudinal direction.

3. The method according to claim 1, which comprises elastically elongating the hollow body in the longitudinal direction during the prestressing of the actuator.

* * * * *